(12) United States Patent
Koo et al.

(10) Patent No.: US 7,692,139 B2
(45) Date of Patent: Apr. 6, 2010

(54) TECHNIQUES FOR COMMENSURATE CUSP-FIELD FOR EFFECTIVE ION BEAM NEUTRALIZATION

(75) Inventors: Bon Woong Koo, Andover, MA (US); Frank Sinclair, Quincy, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 218 days.

(21) Appl. No.: 11/872,576

(22) Filed: Oct. 15, 2007

(65) Prior Publication Data
US 2009/0095894 A1     Apr. 16, 2009

(51) Int. Cl.
*H01J 37/317*      (2006.01)
(52) U.S. Cl. .................. 250/251; 250/492.21
(58) Field of Classification Search ............ 250/492.21, 250/396 ML, 396 R, 251
See application file for complete search history.

(56) References Cited
U.S. PATENT DOCUMENTS 5,206,516 A *  4/1993  Keller et al. ............. 250/492.2
5,399,871 A *  3/1995  Ito et al. .................. 250/492.21
5,703,375 A * 12/1997  Chen et al. .............. 250/492.21
6,762,423 B2    7/2004  Liebert et al.
6,797,968 B2    9/2004  Tsukihara
2009/0026390 A1*  1/2009  Benveniste et al. ..... 250/492.21

FOREIGN PATENT DOCUMENTS
JP    H06-349593 A   12/1994
JP    2004-274060 A   9/2004

OTHER PUBLICATIONS
U.S. Appl. No. 11/568,000, filed Dec. 7, 2006, Smatlak, et al.
* cited by examiner

*Primary Examiner*—Kiet T Nguyen (57) ABSTRACT

A system for ion beam neutralization includes a beamguide configured to transport an ion beam through a dipole field, a first array of magnets and a second array of magnets configured to generate a multi-cusp magnetic field, the first array of magnets being on a first side of the ion beam path and the second array of magnets being on a second side of the ion beam path. The system may further include a charged particle source having one or more apertures configured to inject charged particles into the ion beam. The system may furthermore align the one or more apertures with at least one of the first array of magnets and the second array of magnets to align the injected charged particles from the charged particle source with one or more magnetic regions for an effective charged particle diffusion into the ion beam.

16 Claims, 7 Drawing Sheets

TECHNIQUES FOR COMMENSURATE CUSP-FIELD FOR EFFECTIVE ION BEAM NEUTRALIZATION

FIELD OF THE DISCLOSURE

The present disclosure relates generally to ion implantation and, more particularly, to techniques for commensurate cusp-field for effective ion beam neutralization.

BACKGROUND OF THE DISCLOSURE

Ion implanters are widely used in semiconductor manufacturing to selectively alter the conductivity of materials. In a typical ion implanter, ions generated from an ion source may be transported via an ion beam through a series of beamline components, which may include one or more analyzer and/or collimator magnets and a plurality of electrodes. The analyzer magnets may be used to filter out contaminant species or ions in the ion beam having undesirable energies. The collimator magnets may be used to manipulate the shape of the ion beam or otherwise adjust the quality of the ion beam before it reaches a target wafer. Suitably shaped electrodes may be used to modify the energy and the shape of the ion beam. After the ion beam has been transported through the series of beamline components, it may be directed to an end station to perform ion implantation.

Figure 1:
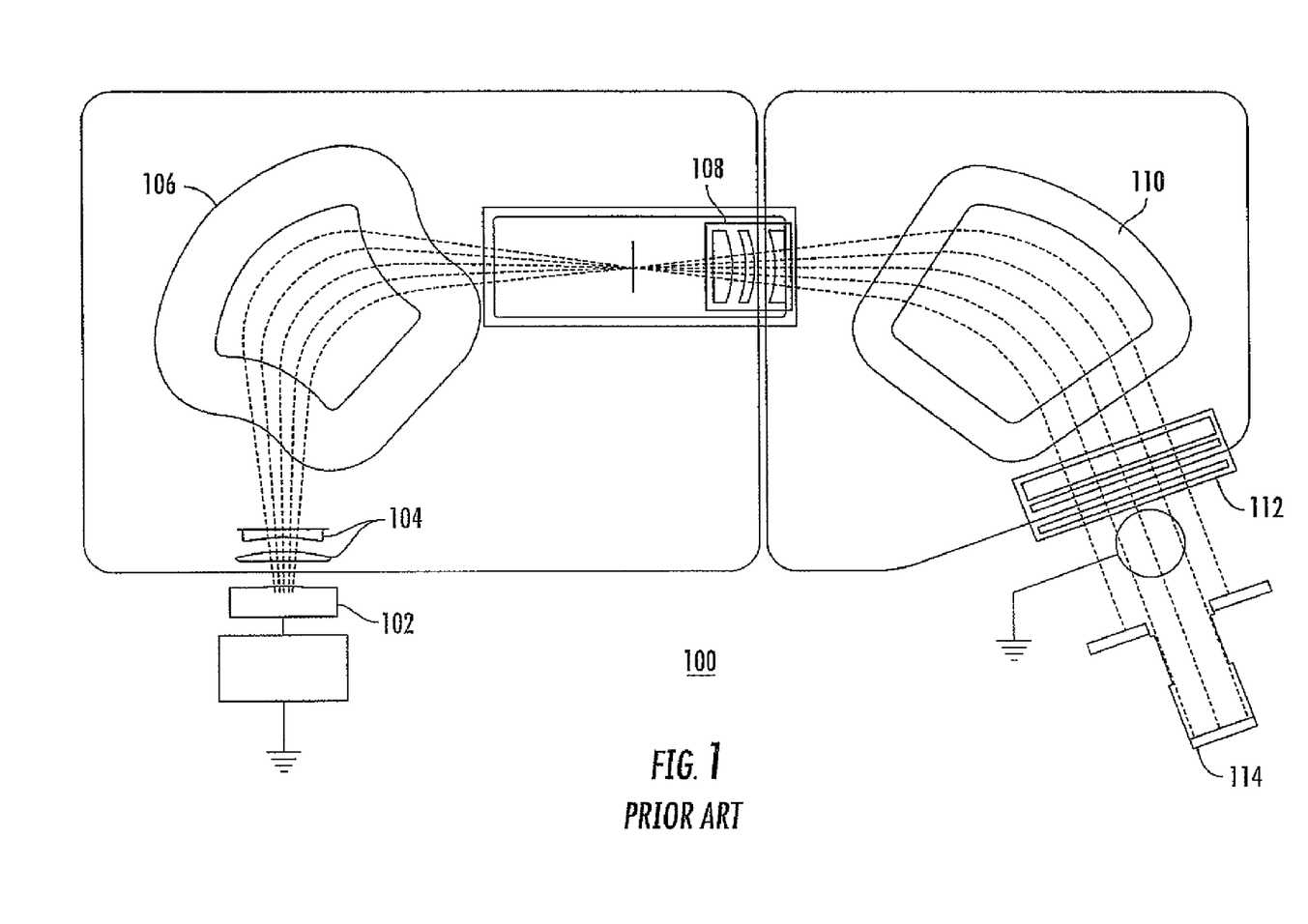
FIG. 1 shows a conventional ion implanter system.

FIG. 1 shows a known ion implanter 100 which comprises an ion source 102, extraction electrodes 104, an analyzer magnet 106, a first deceleration (D1) stage 108, a collimating magnet 110, and a second deceleration (D2) stage 112. The D1 and D2 deceleration stages (also known as "deceleration lenses") are each comprised of multiple electrodes with a defined aperture to allow an ion beam to pass therethrough. By applying different combinations of voltage potentials to the multiple electrodes, the D1 and D2 deceleration lenses can manipulate ion energies and cause the ion beam to hit a target wafer 114 at a desired energy.

As the semiconductor industry keeps reducing feature sizes of micro-electronic devices, ion beams with lower energies are desirable in order to achieve shallow dopant profiles for forming shallow p-n junctions. Meanwhile, it is also desirable to maintain a relatively high beam current in order to achieve a reasonable production throughput. Such low-energy, high-current ion beams may be difficult to transport within typical ion implanters due to space charge blow-up. To prevent "blow-up" of an ion beam, oppositely charged particles, for example electrons or negative ions for positive ion beam, may be introduced for space charge neutralization. One way of sustaining space charge neutralization is through magnetic confinement of negatively charged particles, e.g., electrons. However, existing magnetic confinement approaches tend to introduce extra magnetic field components that can cause ion beam distortion unless carefully designed. In addition, the existing confinement schemes such as multi-cusp magnetic confinement, electrostatic confinement, and other confinement schemes, are not capable to diffuse the charged particles, especially electrons, along the beam direction, which is critical for effective beam neutralization. Moreover, in order to improve low-energy beam transportation, a high-energy ion beam may be decelerated to a desired energy level before reaching a target (e.g., a wafer). In such cases, some ions may go through "charge exchange" with surrounding neutral particles, thus losing their charge state prior to deceleration and generating neutral particles having high energy. Neutral particles having high energy fail to be decelerated and may impact the target at a higher energy level than desired, thus negatively impacting implantation results.

Low-energy ion beams may also be difficult to transport through the beamline to the target due to mutual repulsion between ions having the same charge. High-current ion beams typically include a high concentration of charged ions that tend to diverge due to mutual repulsion. To maintain low-energy, high-current ion beam quality, charged particles such as electrons or a plasma may be injected into the ion beam for the purpose of charge neutralization.

High-energy ion beams typically propagate through a weak plasma that is a byproduct of beam interactions with residual or background gas. This plasma tends to neutralize space charge caused by the ion beam, thereby largely eliminating transverse electric fields that would otherwise disperse the ion beam. However, for a low-energy ion beam, the probability of ionizing collisions with background gas is lower compared to a high-energy ion beam. In addition, low-energy ion beam blow-up may occur at much lower transverse electric field strength. The existing confinement schemes such as multi-cusps magnetic confinement, electrostatic confinement, and other confinement schemes are not capable to diffuse the charged particles, especially electrons, along the beam direction due to the presence of dipole field. Therefore, the existing confinement schemes provide limited capability for an effective beam neutralization.

In view of the foregoing, it may be understood that there are significant problems and shortcomings associated with current techniques for transporting low-energy ion beams.

SUMMARY OF THE DISCLOSURE

Techniques for commensurate cusp-field for effective ion beam neutralization are disclosed. In one particular exemplary embodiment, the techniques may be realized as a charged particle injection system comprising a beamguide configured to transport an ion beam through a dipole field. The charged particle injection system may also comprise a first array of magnets and a second array of magnets configured to generate a multi-cusp magnetic field, positioned along at least a portion of an ion beam path, the first array of magnets being on a first side of the ion beam path and the second array of magnets being on a second side of the ion beam path. The charged particle injection system may further comprise a charged particle source having one or more apertures configured to inject charged particles into the ion beam path. The charged particle injection system may furthermore aligning one or more apertures with at least one of the first array of magnets and the second array of magnets to align the injected charged particles from the charged particle source with one or more magnetic regions for an effective charged particle diffusion into the ion beam path.

In accordance with other aspects of this particular exemplary embodiment, may further comprise a charged particle source configured to generate a charged particle in a region associated with a portion of the ion beam path.

In accordance with additional aspects of this particular exemplary embodiment, the first side of the ion beam path may oppose the second side of the ion beam path.

In accordance with yet another aspect of this particular exemplary embodiment, the charged particle source comprises at least one of an inert gas, an electronegative gas and an electropositive gas.

In accordance with still another aspect of this particular exemplary embodiment, aligning the multi-cusp magnetic field and the dipole field may be configured to generate magnetic pockets.

In accordance with further aspects of this particular exemplary embodiment, the magnetic pockets may be configured near a south or a north polarity magnets of at least one of the first array magnets and the second array magnets.

In accordance with additional aspects of this particular exemplary embodiment, the charged particle source may be embedded in a pole piece along at least a portion of the ion beam path.

In accordance with another aspect of this particular exemplary embodiment, at least one of the first array of magnets and the second array of magnets may be configured to be spaced at a predetermined pitch.

In accordance with still another aspect of this particular exemplary embodiment, the predetermine pitch may be configured to be smaller than a height of the ion beam.

In accordance with additional aspects of this particular exemplary embodiment, at least one of the first array of magnets and the second array of magnets may be at least one of a permanent magnet and a coil.

In accordance with another aspect of this particular exemplary embodiment, at least one of the first array of magnets and the second array of magnets may be configured to form a cross-B loop formed by at least one of diamagnetic drift, E cross B drift, and curvature drift.

In accordance with other aspects of this particular exemplary embodiment, at least one of the first array of magnets and the second array of magnets may be positioned in an analyzer magnet.

In accordance with further aspects of this particular exemplary embodiment, at least one of the first array of magnets and the second array of magnets may be positioned in a collimator magnet.

In accordance with other aspects of this particular exemplary embodiment, the charged particle source may further comprise at least one of a microwave plasma source, a radio frequency plasma source a DC discharge plasma source, a helicon plasma source, a hollow-cathode plasma source and other types of plasma sources.

In accordance with further aspects of this particular exemplary embodiment, the charged particle source may further comprise at least one of a hot filament electron source, a field emission electron source, a nano-tube electron emission source and other types of electron sources.

In accordance with further aspects of this particular exemplary embodiment, wherein the charged particles source may be disposed on at least one of a top surface, a bottom surface and a sidewall surface of the beamguide.

In accordance with yet another aspect of this particular exemplary embodiment, the one or more apertures are aligned with the south polarity magnets of at least one of the first array of magnets and the second array of magnets.

In accordance with additional aspect of this particular exemplary embodiment, the one or more apertures may be aligned with the north polarity magnets of at least one of the first array of magnets and the second array of magnets.

In accordance with further aspects of this particular exemplary embodiment, the injected charged particles may be diffused into the ion beam path via a cross-B drift force.

In accordance with still another aspect of this particular exemplary embodiment, the diffused injected charged particles may be configured to follow a path inside the one or more magnetic region.

In accordance with further aspects of this particular exemplary embodiment, the charged particle source, the one or more apertures and at least one of the first array of magnets and the second array of magnets is rotated at an angle between −90 degrees and 90 degrees.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a better understanding of the present disclosure, reference is now made to the accompanying drawings, in which like elements are referenced with like numerals. These drawings should not be construed as limiting the present disclosure, but are intended to be exemplary only.

DETAILED DESCRIPTION OF EXEMPLARY EMBODIMENTS

Embodiments of the present disclosure overcome inadequacies and shortcomings in existing charged particles diffusion techniques used in ion implanters by providing improved techniques for charged particles diffusion into the ion beam path in an ion implanter. Instead of diffusing charged particles across the magnetic dipole field lines, which makes introduction of charged particles from an auxiliary source challenging, diffusion of charged particles through the shaped magnetic regions is contemplated without disturbing the ion beam shape.

It should be noted that, although the description hereinafter refers to charge particles as the subject of cusp coupling into the ion beam path, the charged particles of various embodiments of the present disclosure, which may include positive ions, negative ions or electrons. Furthermore, charged particles in the present disclosure may include a combination of positive ions, negative ions and electrons. Hereinafter, a specific combination scheme of a cusp magnet, whether a permanent magnet, an electromagnet, or otherwise, and an external charged particle source may sometimes be referred to as components for a system for commensurate cusp field.

Figure 2:
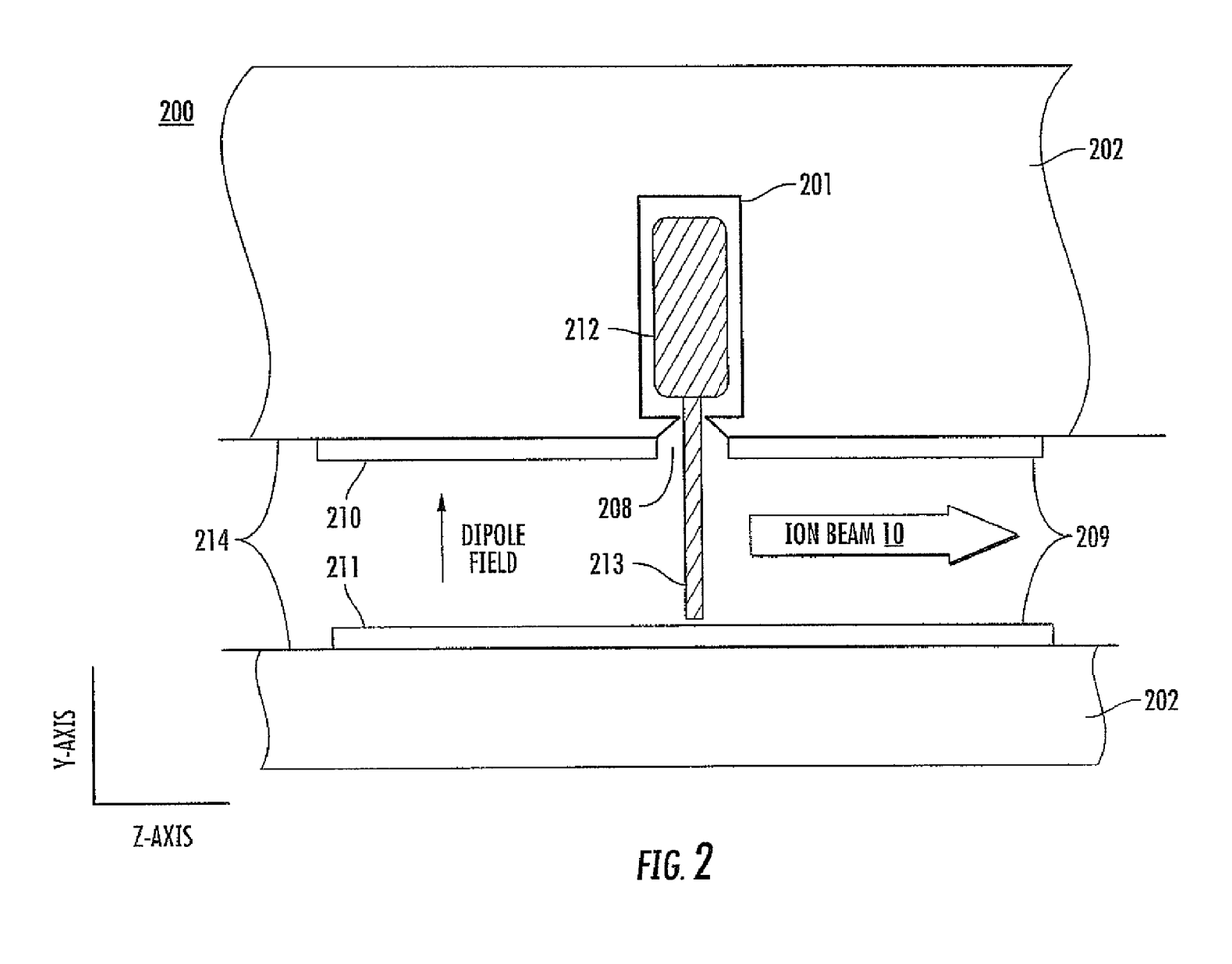
FIG. 2 shows an exemplary sectional view of a cusp coupled charged particle injection system in accordance with an embodiment of the present disclosure.

Referring to FIG. 2, there is shown an exemplary sectional view of a cusp coupled charged particle injection system 200 in accordance with an embodiment of the present disclosure. The system 200 may comprise a charge particle source 201 that may be embedded within a pole piece of bending magnet 202. The charge particle source 201 may be located at any magnetized and/or non-magnetized portion of a path of the ion beam 10 between the ion source 102 and the target wafer 118, as shown in FIG. 1. The pole piece of bending magnet 202 may be a magnetic dipole made of metal (e.g., steel, etc.) having a top and a bottom portion. A magnetic coil may be wound around the periphery of the pole piece of the bending magnet 202 to generate a magnetic dipole field. For example, the charge particle source 201 may be embedded within the analyzer magnet 106 and/or the collimator magnet 110, as shown in FIG. 1.

The charged particle source 201 may be, for example, an electron cyclotron resonance (ECR) plasma source, a radio frequency (RF) plasma source, a helicon plasma source, a hollow cathode plasma source, a DC discharge plasma source, a hot filament electron source, a field emission electron source and/or other similar electron sources. When a plasma source is being used as a charged particle source 201, an auxiliary gas container (not shown) may be coupled to the charge particle source 201 for introducing gas which may be ionized to generate charged particles 212, such as positive ions, negative ions and electrons. The auxiliary gas container may contain helium, neon, nitrogen, argon, krypton, xenon, radon and/or other electronegative or electropositive gases, which may be suitable for plasma generation.

The charged particle source 201 has an aperture 208 extending through an inner wall of the pole piece of the bending magnet 202 and a beamguide 214. Along this inner wall are located magnet arrays 209 for generating a multi-cusp magnetic field. The magnet arrays 209 may be arranged into two arrays, for example, with first array 210 above the path of the ion beam 10 and the second array 211 below the path of the ion beam 10. According to some embodiments, the two magnet arrays 209 may be substantially aligned and in parallel with one another. The magnet arrays 209 may be permanent magnets with their magnetic orientation aligned approximately with the propagation direction of the ion beam 10. In another embodiment, the magnet arrays 209 may be aligned approximately perpendicular to the propagation direction of the ion beam 10. Also, the magnet arrays 209 may be coil coupled to a power source in order to generate a multi-cusp magnetic field. Within each array, polarities of individual magnets may be alternated such that localized multi-cusp magnetic fields may be created in spaces between the magnets (i.e., in or near the beam path of the ion beam 10).

As seen in FIG. 2, the magnet arrays 209 may be magnetized longitudinally along the propagation direction of the ion beam 10 and may be arranged such that adjacent magnets have opposite polarity poles and generate a multi-cusp magnetic field in order to aid the flow of extracted charged particles 213 from the charged particle source 201 along the direction of the ion beam 10. In addition, the magnet arrays 209 may be magnetized perpendicular to the propagation direction of the ion beam 10 and may be arranged in order to aid the flow of extracted charged particles 213 from the charged particle source 201 perpendicular to the direction of the ion beam path 10.

The charged particles 212 generated in the charged particle source 201 may be extracted into the ion beam 10 via the aperture 208, For example, the aperture 208 may be a collection of holes, slots and/or elongated slots across the ion beam 10. Also, the aperture 208 may be distributed across the ion beam 10 (e.g., in the x-direction and Z-direction) to provide more coverage. Further, the apertures 208 may be distributed along the ion beam 10 (e.g., in the z-direction), while the magnet arrays 209 may be aligned perpendicular to the ion beam 10 (e.g., in the x-direction). FIG. 2 illustrates an initial charged particle injection region 213, wherein the charged particles tends to congregate along the aperture 208 because the magnetic dipole field is perpendicular to the propagation direction of the ion beam 10. As a result, without having charged particle spreading and/or diffusion schemes, neutralization of the beam by extracted charged particles 213 may be limited to a small region, similar to the projected aperture 208 region. In order to distribute the charged particles into a larger portion of the ion beam 10 for effective beam neutralization, the magnet arrays 209 may be configured so that charged particles 213 may be diffused across the dipole field. Therefore, the magnet arrays 209, the external charged particle source 201 and/or the aperture 208 may be configured to form commensurate cusp field in a way that charged particles 213 extracted from the aperture 208 may experience effective diffusion across the dipole field, thus increasing the effective neutralization region.

Diffusion mechanism of the extracted charged particles 213 across the dipole field in a commensurate cusp field may depend on the type of the charged particle source 201. For example, the charged particle source 201 may be a plasma source such as a microwave plasma source, a radio frequency plasma source, a helicon plasma source, a DC discharge source, a hollow-cathode discharge source and/or other types of plasma sources. In such cases, the extracted charged particles 213 may be a plasma column, including positive ions, negative ions, and electrons. The localized cusp-field generated by the magnet arrays 209, the plasma density gradient and/or the electric field at the sheath may cause a cross-B (×B) drift motion. The commensurate cusp-field may provide an effective way for the charged particles to diffuse the charged particles along the direction of the ion beam 10.

For example, "cross-B" (×B) drift motion may be include one or more drift mechanisms. The drift mechanisms may include a diamagnetic drift which causes the charged particles drift in a direction of charged particle density gradient (∇n) cross the multi-cusp magnetic field generated by the magnet arrays 209 (B) (∇n×B). The diamagnetic drift may be caused by a charged particle density gradient between a charged particle column and surrounding magnetic fields. The gradient in charged particle density gives rise to a drift in a direction perpendicular to both the charged particle density gradient and the magnetic field.

The drift mechanisms may also include the electric field (E) cross the multi-cusp magnetic field generated by the magnet arrays 209 (B) (E×B). The electrical field (E) may be caused by a potential variation inside the initial charged particle injection region 213 and/or a potential drop from the charged particles to the inner wall of a beamguide 214, which may be referred to as a "sheath". A sheath may be formed in a region between the charged particles and the adjacent wall of the beamguide 214 where electron flux to the wall is reduced to a corresponding ion flux. In addition, a sheath region may have a higher electric field than an electric field associated with the charged particles. According to the sheath formation mentioned above, the E×B drift mechanism may cause an electric field perpendicular to the inner wall of the beamguide 214. A drift results in a direction perpendicular to both the electric field associated with the sheath formation and the multi-cusp magnetic field generated by the magnet arrays 209.

The drift mechanisms may further include a curvature drift (R×B) which may be defined by a radius of curvature of the multi-cusp magnetic field generated by the magnet arrays 209 (R) cross the multi-cusp magnetic field generated by the magnet arrays 209 (B) (R×B). The curvature drift (R×B) may be caused by the curvature of the magnetic field lines, through a centrifugal force effect. The curvature drift (R×B) may impart a drift motion perpendicular to both the radius of curvature and the magnetic field.

Further, the charged particle source 201 may be an electron source such as a hot filament source, a field emission source, nano-tube field emission source, and/or other types of electron sources. In such cases, the extracted charged particle 213 may be an electron column. Then the localized cusp-field generated by the magnet arrays 209, the electron density gradient and/or the electric field at the sheath may cause a cross-B (×B) drift motion. For example, as mentioned above, the cross-B (×B) drift motion may include a diamagnetic drift (i.e., electron density gradient), and curvature drift (i.e., localized cusp-field) and/or other drift mechanisms. The commensurate cusp-field may provide an effective way for electrons to diffuse along the direction of the ion beam 10.

In addition, as illustrated in FIG. 2, the charged particle source 201, the apertures 208 and the magnet arrays 209 may be aligned in the z-direction. However, the charged particle source 201, the apertures 208 and the magnet arrays 209 may be rotated and/or aligned at any angle respect to the dipole field in the y-direction. For example, the charged particle source 201, the apertures 208 and the magnet arrays 209 may be aligned in the x-direction and may increase the effective ion beam neutralization in the x-direction.

Figure 3:
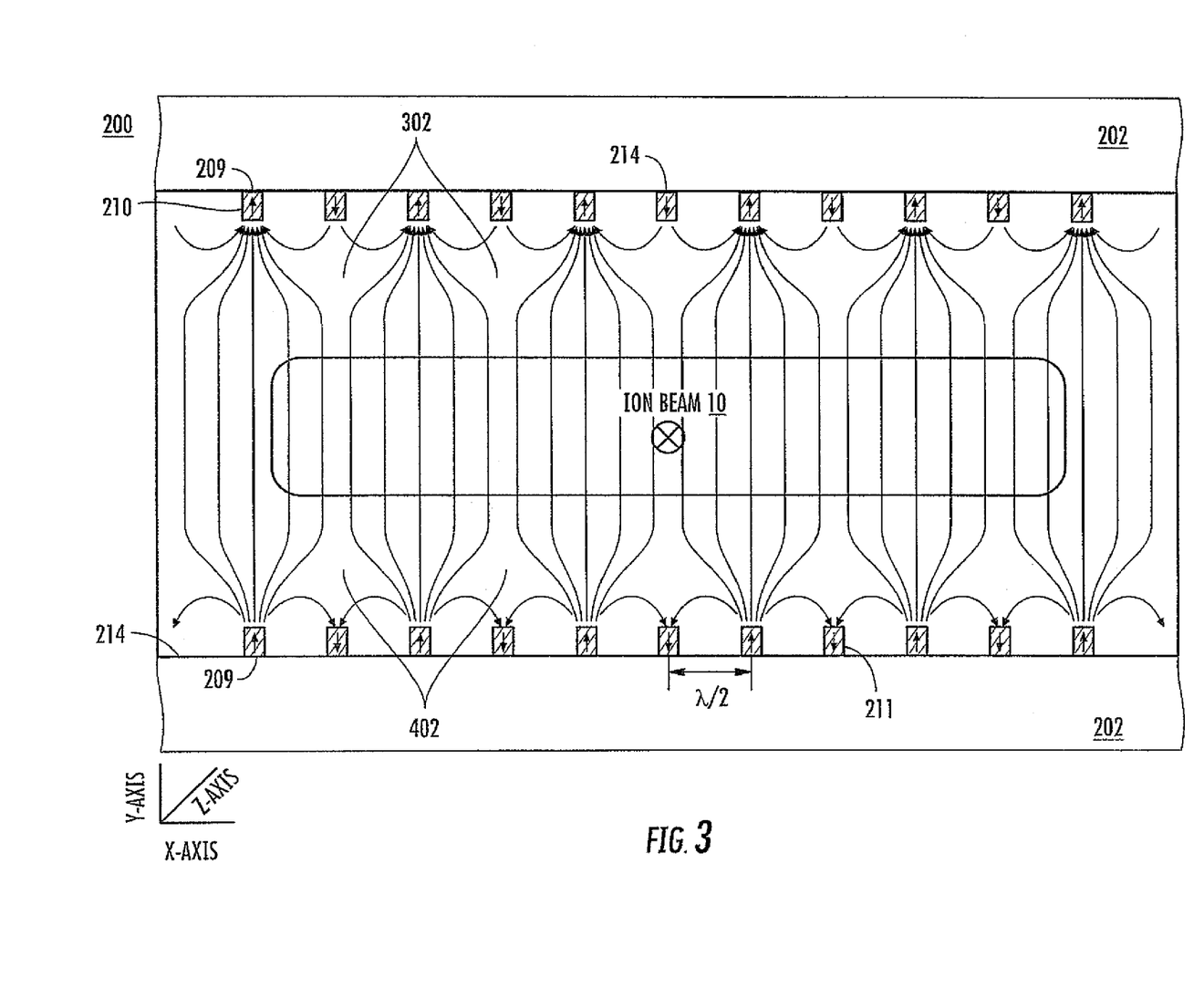
FIG. 3 illustrates an exemplary sectional view of a dipole field and a multi-cusp magnetic field produced by magnet arrays in accordance with an embodiment of the present disclosure.

FIG. 3 illustrates an exemplary sectional view of a dipole field and a multi-cusp field produced by magnet arrays in accordance with an embodiment of the present disclosure. It will be appreciated that the sizing, the orientation, and the spacing of magnet arrays 209 may be adjusted to generate a predetermined multi-cusp field. For example, a dipole field in the y-axis direction may exist in the beamguide 214. Also, a magnetic pitch may be associated with the dipole field in the y-direction in the beamguide 214. Because the dipole field in the beamguide 214 is in the y-direction, the dipole field may impede the flow of the extracted charged particles 213 along the Z-direction.

Also for example, the multi-cusp magnetic field may form from the north pole of the magnet arrays 209 to the south pole of the magnet arrays 209. The strength of localized cusp magnetic field due to the magnet arrays 209 may be varied by changing the magnetic pitch, the distance between adjacent magnets of the magnet arrays 209, shown as $\lambda/2$. In order not to prevent the localized cusp magnetic field from disturbing the ion beam 10, the magnetic pitch $\lambda/2$ may be configured that the edge of the ion beam 10 may not see the localized cusp magnetic field. In addition, the spacing between adjacent magnets in the magnet arrays 209 may be changed in order to vary the influence of the multi-cusp magnetic field on the dipole field of the beamguide 214 and/or the ion beam 10. Moreover, the multi-cusp magnetic field of the magnet arrays 209 may be aligned with the dipole field in the beamguide 214. For example, the magnets of the magnet arrays 209 may be spaced at a predetermined distance to align the multi-cusp magnetic field with the dipole field of the beamguide 214. The magnets of the magnet arrays 209 may be spaced at a predetermined pitch ($\lambda/2$), e.g., 1 cm or less. When the predetermined pitch ($\lambda/2$) is much smaller than the height of the ion beam 10 and the beamguide 214, the multi-cusp magnetic field generated by the magnet arrays 209 may not influence the ion beam 10 path. In contrast, when the predetermined pitch ($\lambda/2$) is equal or comparable to the height of the ion beam 10, the multi-cusp magnetic field may influence the ion beam 10 path.

Furthermore, by aligning the dipole field in the beamguide 214 with the multi-cusp magnetic field of the magnet arrays 209, magnetic pockets 302 and 402 may be formed at the top and bottom portions of the magnet arrays 209, respectively. The magnetic pockets 302 and 402 may be formed in an area adjacent the south poles of the magnet arrays 209. The magnetic pockets 302 and 402 may confine the charged particles 212 and/or facilitate an effective beam neutralization.

Figure 4:
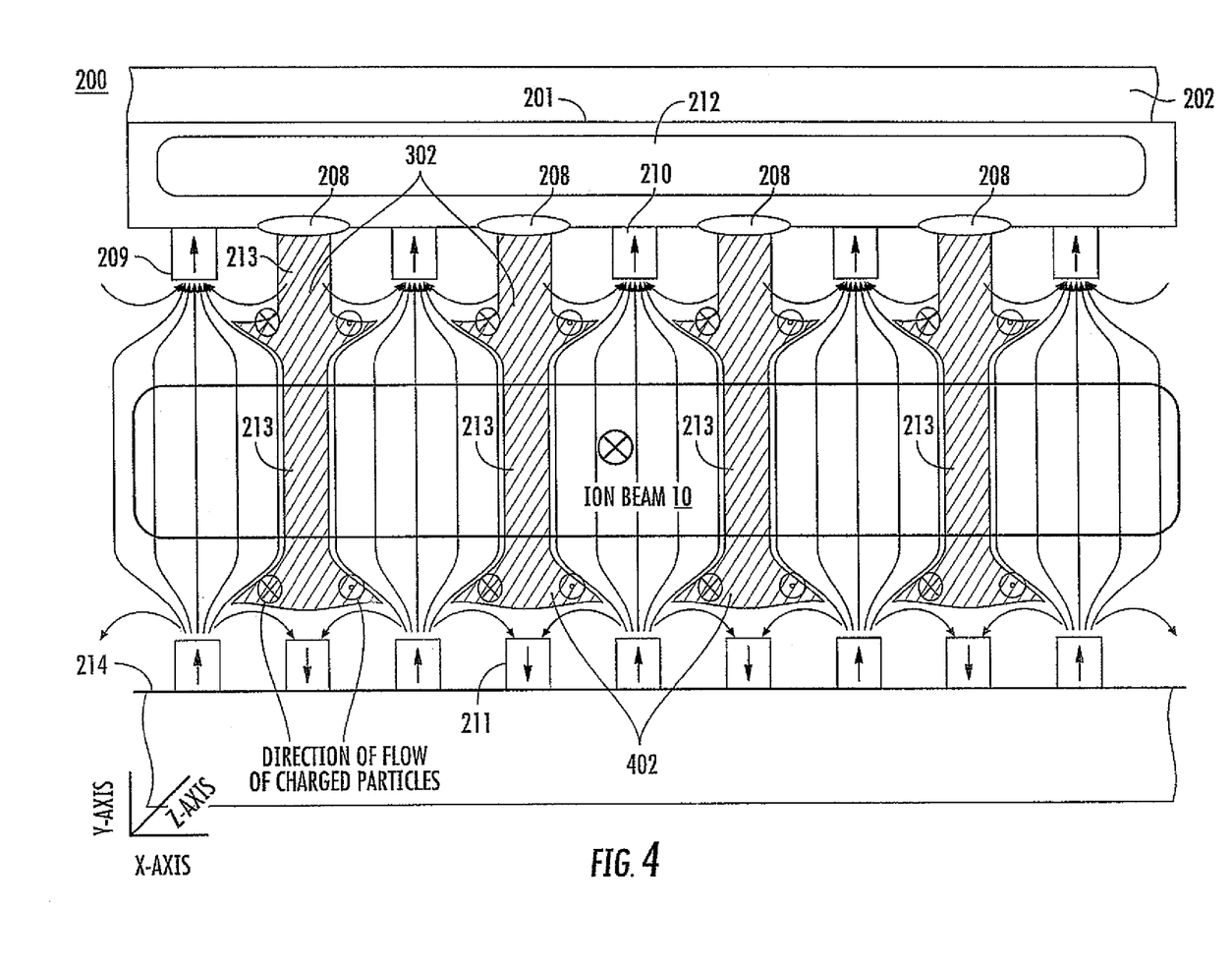
FIG. 4 shows an exemplary sectional view of a commensurate cusp coupled charged particle injection system, located on the top of the beamguide, in accordance with an embodiment of the present disclosure.

FIG. 4 illustrates an exemplary sectional view of the commensurate cusp-coupled charged particle injection system 200 in accordance with an embodiment of the present disclosure. As illustrated in FIG. 4, the multi-cusp magnet field of the magnet arrays 209 may be aligned with the aperture 208 to form a "commensurate cusp field" so that each column of the extracted charged particles 213 may be effectively confined in magnetic pockets 302 and/or 402, For example, the charged particle source 201 may be located at a top portion of the beamguide 214, the aperture 208 may be aligned with the south pole of the magnet arrays 209 to confine the extracted charged particle 213 to the magnetic pockets 302 and 402. The extracted charged particle 213 may form straight column in a middle portion of the beamguide 214. Also, the extracted charged particles 213 may be confined in wing-shaped portions of the magnetic pockets 302 and/or 402. The extracted charged particles 213 confined in the straight column in the middle portion of the beamguide 214 may not affect the ion beam 10 in the z-direction. However, the extracted charged particles 213 confined in the wing-shaped portions may be affected by the "cross-B" (×B) force as described above. Therefore, the extracted charged particles 213 confined in the wing-shaped portion may move along with the ion beam 10, in the z-direction. The "cross-B" (×B) movement of the charged particles along the z-direction expand the effective beam neutralization region, and thus improve the efficiency of the beam neutralization.

In the even that the apertures 208 may be randomly distributed along the magnet arrays 209. The extracted charged particles 213 may be randomly confined by the magnetic pockets 302 and/or 402. The extracted charged particles 213 may be confined in the y-direction and increase the charged particle density in the y-direction. Although, the extracted charged particles 213 may be confined in the y-direction, the extracted charged particles 213 may not be affected by the "cross-B" (×B) drift mechanisms. Therefore, the extracted charged particles 213 may not spread in the z-direction and thus may not increase the effective beam neutralization volume.

Figure 5:
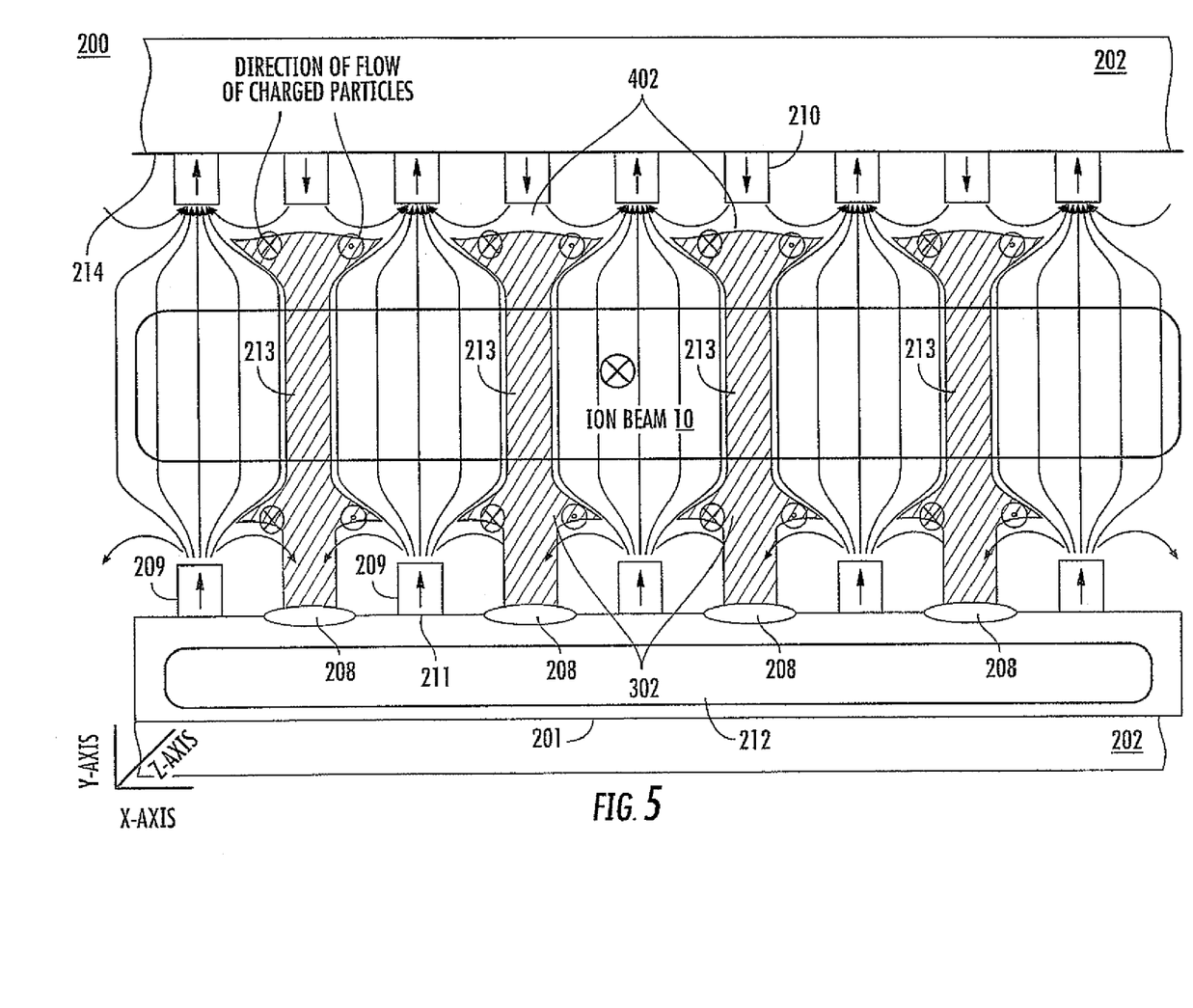
FIG. 5 shows an exemplary sectional view of a commensurate cusp coupled charged particle injection system, located on the bottom of the beamguide in accordance with an embodiment of the present disclosure.

FIG. 5 illustrates another exemplary sectional view of the commensurate cusp-coupled charged particle injection system 200 in accordance with an embodiment of the present disclosure. The charged particle source 201 may be disposed at the top surface, bottom surface and/or sidewall surface of the beamguide 214. As illustrated in FIG. 5, the charged particle source 201 may be disposed at the bottom surface of the beamguide 214. Also, the aperture 208 may be configured on the beamguide 214 to allow the charged particles 212 injected into the ion beam 10 path. For example, the charged particle source 201 may be disposed at the bottom surface of the beamguide 214, the aperture 208 may be aligned with the south polarity of the magnet arrays 209 to effectively increase an effective beam neutralization area for the ion beam 10. The charged particles 212 injected into the ion beam 10 through aperture 208 may be confined in magnetic pockets 302 and/or 402, forming wing-shaped portions where the extracted charged particles 213 may experience a "cross-B" (×B) drift mechanisms. The magnetic pockets 302 and/or 402 may be formed by a combination of magnetic field in a region near the south pole of the magnet arrays 209. The extracted charged particles 213 may spread to conform to the shape of the magnetic pockets 302 and/or 402.

Figure 6:
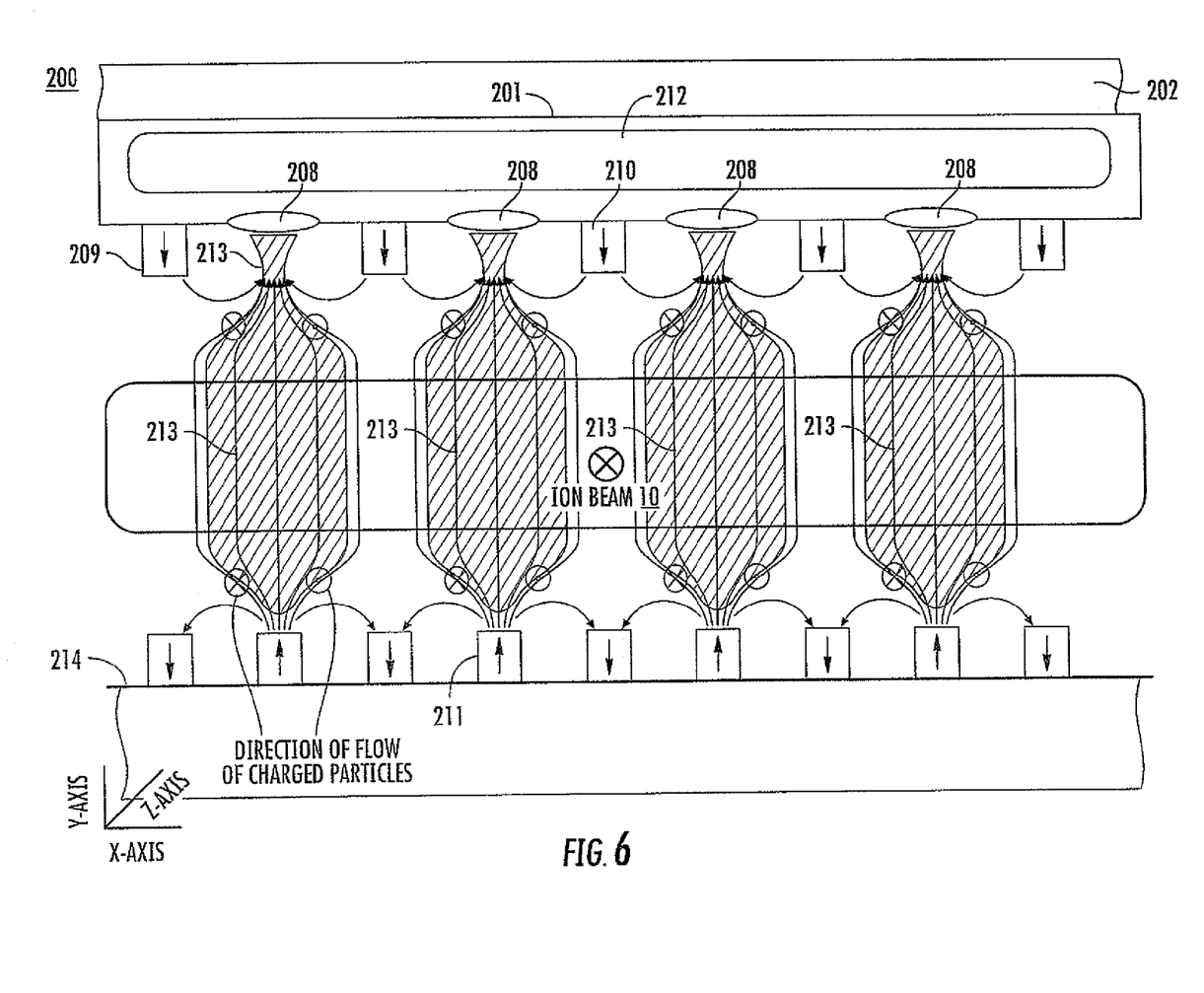
FIG. 6 shows an exemplary sectional view of a commensurate cusp coupled charged particle injection system, located on the top of the beamguide in accordance with an embodiment of the present disclosure.

FIG. 6 illustrate an exemplary sectional view of the commensurate cusp-coupled charged particle injection system 200 in accordance with an embodiment of the present disclosure. As illustrated in FIG. 6, the multi-cusp magnetic field of the magnet arrays 209 may be aligned with the apertures 208 to form a "commensurate cusp field." For example, the charged particle source 201 may be located at a top portion of the beamguide 214, the apertures may be aligned with the north pole of the magnet arrays 209. The extracted charged particles 213 may follow a magnetic field pattern of the "commensurate cusp field." The magnetic field pattern of the "commensurate cusp field" may cover a larger portion of the ion beam 10 and therefore may increase the effective ion beam neutralization region (e.g., in the x-direction). In addition, the shape and/or the confinement characteristic of the magnetic field pattern of the "commensurate cusp field" may exert a cross-B (×B) drift force on a portion of the extracted charged particles 213. The cross-B (×B) drift force may diffuse the extracted charged particles 213 into the ion beam 10 and thus increase the effective beam neutralization region.

Figure 7:
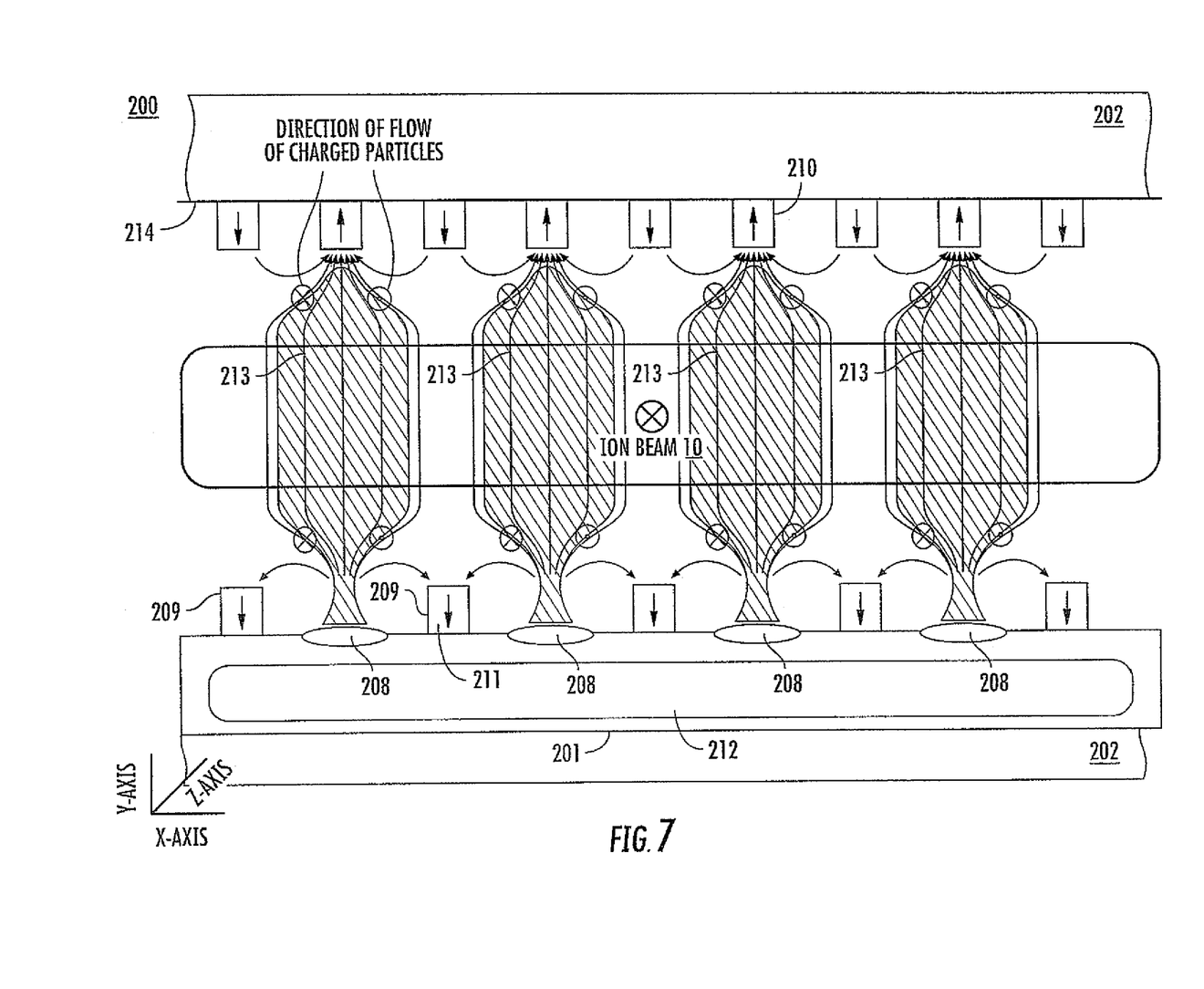
FIG. 7 shows an exemplary sectional view of a commensurate cusp coupled charged particle injection system, located on the bottom of the beamguide in accordance with an embodiment of the present disclosure.

FIG. 7 illustrates an exemplary sectional view of the commensurate cusp-coupled charged particle injection system 200 in accordance with an embodiment of the present disclosure. The charged particles source 201 may be disposed at the top surface, bottom surface and/or sidewall surface of the beamguide 214. As illustrated in FIG. 7, the charged particle source 201 may be disposed at the bottom surface of the beamguide 214. Also, the apertures 208 may be configured on the bottom surface of the beamguide to allow the charged particles 212 to inject into the ion beam 10 path. In the event that the charged particles source 201 may be disposed at the bottom surface of the beamguide 214, the apertures 208 may be aligned with the north pole of the magnet arrays 209. The extracted charged particles 213 may follow a magnetic field pattern of the "commensurate cusp field." The magnetic field pattern of the "commensurate cusp field" may cover a larger portion of the ion beam 10 and therefore may increase the effective ion beam neutralization region (e.g., in the x-direction). In addition, the shape and/or the confinement characteristic of the magnetic field pattern of the "commensurate cusp field" may exert a cross-B (×B) drift force on a portion of the extracted charged particles 213. The cross-B (×B) drift force may diffuse the extracted charged particles 213 into the ion beam 10 and thus increase the effective beam neutralization region.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. A system for commensurate cusp field for effective ion beam neutralization, comprising:
    a beamguide configured to transport an ion beam through a dipole field;
    a first array of magnets and a second array of magnets configured to generate a multi-cusp magnetic field, the first array of magnets being on a first side of the ion beam and the second array of magnets being on a second opposing side of the ion beam, each magnet of the first and second array of magnets having a long dimension parallel to a direction of travel of the ion beam and positioned at a selected width position along a width of the ion beam so that each magnet of the first array of magnets has a corresponding magnet of the second array of magnets at the selected width position having a similar polarity; and
    a charged particle source having a plurality of apertures configured to inject charged particles into the ion beam, wherein each of the plurality of apertures are positioned at the selected width position of a lesser plurality of the plurality of magnets of the first array along the long dimension of the lesser plurality of magnets so the multi-cusp magnetic field and the dipole field are substantially aligned at the plurality of apertures to generate magnetic pockets to accept the injected charged particles from the charged particle source and direct flow of the charged particles along the magnetic pockets in a direction parallel to the direction of travel of the ion beam.

2. The system for commensurate cusp field for effective ion beam neutralization according to claim 1, wherein the charged particle source is configured to receive a gas from a gas source, the gas comprising at least one of an inert gas, an electronegative gas and an electropositive gas.

3. The system for commensurate cusp field for effective ion beam neutralization according to claim 1, wherein the magnetic pockets are configured near south polarity magnets or north polarity magnets of at least one of the first array of magnets and the second array of magnets.

4. The system for commensurate cusp field for effective ion beam neutralization according to claim 1, wherein the charged particle source is embedded in a pole piece.

5. The system for commensurate cusp field for effective ion beam neutralization according to claim 1, wherein at least one of the first array of magnets and the second array of magnets are configured to be spaced at a predetermined pitch.

6. The system for commensurate cusp field for effective ion beam neutralization according to claim 5, wherein the predetermined pitch is configured to be smaller than a height of the ion beam.

7. The system for commensurate cusp field for effective ion beam neutralization according to claim 1, wherein at least one of the first array of magnets and the second array of magnets is at least one of a permanent magnet and a coil.

8. The system for commensurate cusp field for effective ion beam neutralization according to claim 7, wherein at least one of the first array of magnets and the second array of magnets configured to form a cross-B loop formed by at least one of diamagnetic drift, E cross B drift, and curvature drift.

9. The system for commensurate cusp field for effective ion beam neutralization according to claim 1, wherein the first array of magnets and the second array of magnets are positioned in an analyzer magnet configured to generate the dipole field.

10. The system for commensurate cusp field for effective ion beam neutralization according to claim 1, wherein the first array of magnets and the second array of magnets are positioned in a collimator magnet configured to generate the dipole field.

11. The system for commensurate cusp field for effective ion beam neutralization according to claim 1, wherein the charged particle source comprises at least one of a microwave plasma source, a radio frequency plasma source, a DC discharge plasma source, a helicon plasma source and a hollow-cathode plasma source.

12. The system for commensurate cusp field for effective ion beam neutralization according to claim 1, wherein the charged particle source comprises at least one of a hot filament electron source, a field emission electron source and a nano-tube electron emission source.

13. The system for commensurate cusp field for effective ion beam neutralization according to claim 1, wherein the charged particles source is disposed on at least one of a top surface, a bottom surface and a sidewall surface of the beamguide.

14. The system for commensurate cusp field for effective ion beam neutralization according to claim 1, wherein the plurality of apertures are aligned with the south polarity magnets of the second array of magnets.

15. The system for commensurate cusp field for effective ion beam neutralization according to claim 1, wherein the plurality of apertures are aligned with north polarity magnets of the second array of magnets.

16. The system for commensurate cusp field for effective ion beam neutralization according to claim 1, wherein the injected charged particles are diffused into the ion beam via a cross-B drift force.

* * * * *